(12) United States Patent
Kuloor et al.

(10) Patent No.: US 11,183,878 B2
(45) Date of Patent: Nov. 23, 2021

(54) MAINTAINING CONNECTIVITY INFORMATION FOR METERS AND TRANSFORMERS LOCATED IN A POWER DISTRIBUTION NETWORK

(71) Applicant: LANDIS+GYR INNOVATIONS, INC., Alpharetta, GA (US)

(72) Inventors: Soorya Kuloor, Cary, NC (US);
Chethana Kuloor, Cary, NC (US);
Umang Deora, Alpharetta, GA (US);
Anthony DeRubeis, East Point, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 211 days.

(21) Appl. No.: 16/057,178

(22) Filed: Aug. 7, 2018

(65) Prior Publication Data
US 2019/0041445 A1    Feb. 7, 2019

Related U.S. Application Data

(60) Provisional application No. 62/541,934, filed on Aug. 7, 2017, provisional application No. 62/624,365, filed on Jan. 31, 2018.

(51) Int. Cl.
*G01R 31/50* (2020.01)
*H02J 13/00* (2006.01)
*G01R 19/25* (2006.01)

(52) U.S. Cl.
CPC ........ *H02J 13/00034* (2020.01); *G01R 31/50* (2020.01); *H02J 13/0017* (2013.01); *G01R 19/2513* (2013.01)

(58) Field of Classification Search
CPC ..... G01R 31/50; G01R 19/2513; H02J 13/00; H02J 13/00006; H02J 13/00034;
(Continued)

(56) References Cited

U.S. PATENT DOCUMENTS 6,615,147 B1   9/2003 Jonker et al.
6,816,360 B2   11/2004 Brooksby et al.
(Continued)

FOREIGN PATENT DOCUMENTS

| WO | 2018072030 | 4/2018 |
|---|---|---|
| WO | 2018083902 | 5/2018 |
| WO | 2019026791 | 2/2019 |

OTHER PUBLICATIONS

Tom A. short, Advanced Metering for Phase Identification, Transformer Identification, and Secondary Modeling, Jun. 2013, IEEE Transactions on Smart Grid, vol. 4, No. 2, pp. 651-658 (Year: 2013).*

(Continued)

*Primary Examiner* — Toan M Le
(74) *Attorney, Agent, or Firm* — Kilpatrick Townsend & Stockton LLP

(57) ABSTRACT

Methods for verifying and updating connectivity information in a geographic information system may consider location information for meters and transformers and voltage data obtained by the meters. Meters that are incorrectly associated with a transformer may be flagged and candidate transformers may be evaluated to identify a correct association. The analysis may consider voltage data from multiple meters to determine correlation values. Correlation values or confidence factors may be used to identify a transformer for the correct association.

16 Claims, 12 Drawing Sheets

(58) Field of Classification Search
CPC ...... H02J 13/0017; Y04S 20/48; Y04S 40/12; Y02E 60/7807; Y02E 60/00
See application file for complete search history.

(56) References Cited

U.S. PATENT DOCUMENTS

| | | | |
|---|---|---|---|
| 7,135,850 | B2 | 11/2006 | Ramirez |
| 7,469,190 | B2 | 12/2008 | Bickel |
| 7,693,670 | B2 | 4/2010 | Durling et al. |
| 7,990,806 | B2 | 8/2011 | Chen |
| 8,004,933 | B2 | 8/2011 | Iseli |
| 8,121,741 | B2 | 2/2012 | Taft et al. |
| 8,223,466 | B2 | 7/2012 | Roscoe |
| 8,322,215 | B2 | 12/2012 | Lakich et al. |
| 8,326,554 | B2 | 12/2012 | Caird |
| 8,635,036 | B2 | 1/2014 | Pamulaparthy et al. |
| 8,754,634 | B2 | 6/2014 | Chamarti et al. |
| 8,830,083 | B2 | 9/2014 | LaFrance et al. |
| 8,854,217 | B2 | 10/2014 | Brown et al. |
| 8,947,246 | B2 | 2/2015 | Aiken |
| 8,978,443 | B2 | 3/2015 | Ramirez |
| 8,996,144 | B2 | 3/2015 | LaFrance et al. |
| 9,164,135 | B2 | 10/2015 | Cs et al. |
| 9,304,014 | B2 | 4/2016 | Komati et al. |
| 9,341,686 | B2 | 5/2016 | Deak et al. |
| 9,476,740 | B2 | 10/2016 | Zigovszki et al. |
| 9,557,392 | B2 | 1/2017 | Schuhl et al. |
| 9,568,522 | B2 | 2/2017 | Aiello et al. |
| 9,602,895 | B2 | 3/2017 | Bowling et al. |
| 9,658,081 | B2 | 5/2017 | Vaswani et al. |
| 9,671,254 | B2 | 6/2017 | Zigovszki et al. |
| 9,706,499 | B2 | 7/2017 | Pike et al. |
| 9,887,051 | B2 | 2/2018 | LaFrance et al. |
| 9,891,088 | B2 | 2/2018 | Zigovszki et al. |
| 10,240,961 | B2 | 3/2019 | Cheng et al. |
| 10,254,315 | B2 | 4/2019 | Higashi et al. |
| 10,295,578 | B2 | 5/2019 | Higashi et al. |
| 2012/0182157 | A1 | 7/2012 | Carr |
| 2014/0005853 | A1 | 1/2014 | Chen et al. |
| 2015/0052088 | A1* | 2/2015 | Arya .................. H02J 3/00 706/12 |
| 2015/0241482 | A1* | 8/2015 | Sonderegger ...... G01R 19/0084 702/65 |
| 2016/0352103 | A1 | 12/2016 | Aiello et al. |
| 2018/0073910 | A1 | 3/2018 | Deak et al. |
| 2018/0106640 | A1 | 4/2018 | Padrones et al. |
| 2019/0041436 | A1 | 2/2019 | Kuloor et al. |
| 2019/0041439 | A1 | 2/2019 | Brown |
| 2019/0094329 | A1 | 3/2019 | Minich |
| 2019/0101411 | A1 | 4/2019 | Davis et al. |
| 2019/0129368 | A1 | 5/2019 | Iacovella et al. |
| 2019/0219618 | A1 | 7/2019 | Davis et al. |

OTHER PUBLICATIONS

Luan et al., Smart Meter Data Analytics for Distribution Network Connectivity Verification, Jul. 2015, IEEE Transactions on Smart Grid, vol. 6, No. 4, pp. 1964-1971 (Year: 2015).*

IEEE_Xplore Search Results, Mar. 24, 2021, 1 pp. (Year: 2021).*

Arya et al., "Phase Identification in Smart Grids", IEEE International Conference on Smart Grid Communications (SmartGridComm), Brussels, 2011, pp. 25-30.

Byun et al., "Cable and Phase Identification based on Power Line Communication", International Journal of Control and Automation, vol. B, No. 9, 2015, pp. 63-74.

Power Systems Integrity, Inc., "Live Line Phase Identification—Phase ID 6000", available online at http://www.psinteg.com/Phase_ID.html at least as early as Feb. 2020, 2 pages.

International Patent Application No. PCT/US2021/018980, International Search Report and Written Opinion, dated Jun. 11, 2021, 14 pages.

* cited by examiner

FIG. 9A

| | 1 | 2 | 3 | 4 | 5 | 6 |
|---|---|---|---|---|---|---|
| 1 | 1.0000 | | | | | |
| 2 | 0.8923 | 1.0000 | | | | |
| 3 | 0.8923 | 0.9745 | 1.0000 | | | |
| 4 | 0.9852 | 0.8695 | 0.8618 | 1.0000 | | |
| 5 | 0.9917 | 0.8547 | 0.8595 | 0.9757 | 1.0000 | |
| 6 | 0.9151 | 0.9768 | 0.9777 | 0.8849 | 0.8812 | 1.0000 |

FIG. 9B

| | 1 | 2 | 3 | 4 | 5 |
|---|---|---|---|---|---|
| 1 | 1.0000 | | | | |
| 2 | 0.3850 | 1.0000 | | | |
| 3 | 0.9525 | 0.3764 | 1.0000 | | |
| 4 | 0.9565 | 0.3975 | 0.9935 | 1.0000 | |
| 5 | 0.9547 | 0.3971 | 0.9909 | 0.9923 | 1.0000 |

| Meterid | Transformer | Avg Corr | # meters when removed | | Possible Transformers | # of meters | Avg Corr | Distance from Transformer | Notes |
|---|---|---|---|---|---|---|---|---|---|
| | | | | Based on # of Correlations | | | | | |
| 5356098 | 35776027 | 0.3890 | 5 | | 302533166 | 14 | 0.7773 | 132.1877391 | most meters on single transformer with correlations |
| | | | | | 307523185 | 13 | 0.8143 | 379.9767297 |  |
| | | | | | 35760228 | 10 | 0.8222 | 1563.313448 |  |
| | | | | | 302533390 | 10 | 0.8150 | 295.2275655 |  |
| 5356098 | 35776027 | 0.3890 | 5 | Based on Correlation Value | 35776027 | 1 | 1.0000 | 66.74632803 | transformer with meters that shows best average correlation (also nearby) |
| | | | | | 35957299 | 1 | 0.8950 | 4187.664558 |  |
| | | | | | 302532698 | 1 | 0.8892 | 2702.822053 |  |
| | | | | | 302533395 | 1 | 0.8833 | 4067.098934 |  |

FIG. 10

MAINTAINING CONNECTIVITY INFORMATION FOR METERS AND TRANSFORMERS LOCATED IN A POWER DISTRIBUTION NETWORK

TECHNICAL FIELD

This disclosure generally relates to geographic information systems for distribution networks, and more particularly relates to maintaining connectivity information for meters and transformers.

BACKGROUND

Utilities typically manually track connectivity or associations between meters and distribution transformers. For large utilities the number of meters can be upwards of a few million with distribution transformers being close to a million. A Geographic Information System (GIS) may maintain a record of the connections between the meters and the transformers. This connectivity information is critical as utilities move to more automated ways of detecting outages based on meter outage signals. It allows utilities to notify customers that may be affected by an outage or by maintenance and planned construction work. Regulatory bodies may impose fines on utilities that do not notify customers or notify the wrong customers for these types of activities. In addition, connectivity information may be needed for advanced planning and operational applications including, but not limited to load management. Therefore, having accurate connectivity information has become more and more critical. Since existing processes for maintaining connectivity information is manual and error prone, an improved process is needed.

SUMMARY

Aspects and examples are provided for maintaining connectivity information for meters and transformers located in a power distribution network. One exemplary method includes selecting a meter, obtaining voltage data for the selected meter and voltage data for other meters, where the voltage data may include measured voltages for a number of interval periods within a time range. The voltage data for the selected meter is compared with the voltage data for the other meters and a correlation value is determined for each comparison. The correlation values are used identify a set of transformers. A confidence factor is determined for each of the transformers and the confidence factors are used to identify a transformer for association with the selected meter.

Another exemplary method includes receiving voltage data for a number of meters associated with a transformer and comparing the voltage data for a meter with the voltage data for the other meters. If the comparison indicates that the meter is incorrectly associated with the transformer based on the voltage correlations, then voltage data for another set of meters associated with another transformer is evaluated. A confidence factor based on an average correlation value between the voltage data for the meter and the voltage data for the set of meters associated with the other transformer and a number of meters with voltage data that satisfies a correlation threshold is calculated. When the confidence factor satisfies a confidence threshold, the method updates an association between the meter and the other transformer maintained by the head-end system.

Other methods may also be used, including a method that includes selecting a transformer and selecting transformers within a predetermined geographic distance of the transformer and then selecting meters associated with any of the selected transformers or located within a predetermined geographic distance of the selected transformer. The method may use voltage profiles for the meters to generate correlation coefficients. The correlation coefficients are used to calculate confidence factors indicating the probability that a meter is connected to a transformers. The confidence factor may be based on a weighted sum of the maximum correlation coefficient and an average of the correlation coefficients for the meters.

The connectivity information may be used by the head-end system in connection with various network activities including the management of outage notifications and load balancing.

These illustrative examples are mentioned not to limit or define the disclosure, but to provide examples to aid understanding thereof. Additional examples are discussed in the Detailed Description, and further description is provided there.

BRIEF DESCRIPTION OF THE DRAWINGS

Features, examples, and advantages of the present disclosure are better understood when the following Detailed Description is read with reference to the accompanying drawings.

FIG. 9A and FIG. 9B depicts exemplary voltage correlations.

FIG. 10 depicts exemplary voltage correlations and connectivity information.

DETAILED DESCRIPTION

A GIS (Geographic Information System) for a resource distribution network may maintain information about the assets on the network. In the case of a power distribution network, the assets may include meters located at premises and distribution transformers, as well as other assets and devices. The information may include geographic location information specifying the location of the asset and connectivity information specifying a connection or association between assets, such as a connection between a meter and a transformer.

The present invention provides methods for verifying and updating the GIS information. In one example, an analysis is performed to flag meters that are incorrectly associated with a transformer and predict the correct association. The analysis may use GIS location information, GIS connectivity information, and operating data, such as voltage data received from the meters. The analysis may consider GIS location information to determine whether location data associated with a meter is correct. The analysis may consider voltage data from multiple meters to determine whether the GIS connectivity information for a meter is correct and if not, to identify or predict a transformer to which the meter is connected. In some implementations, confidence factors are used to identify a transformer to which the meter is likely connected.

In another example, a transformer or feeder is selected and an analysis is performed on all meters and transformers located within an area around the selected transformer in order to verify and possibly correct the connectivity information for the meters and transformers in the area. The analysis uses voltage data and confidence factors.

Exemplary Operating Environment

Figure 1:
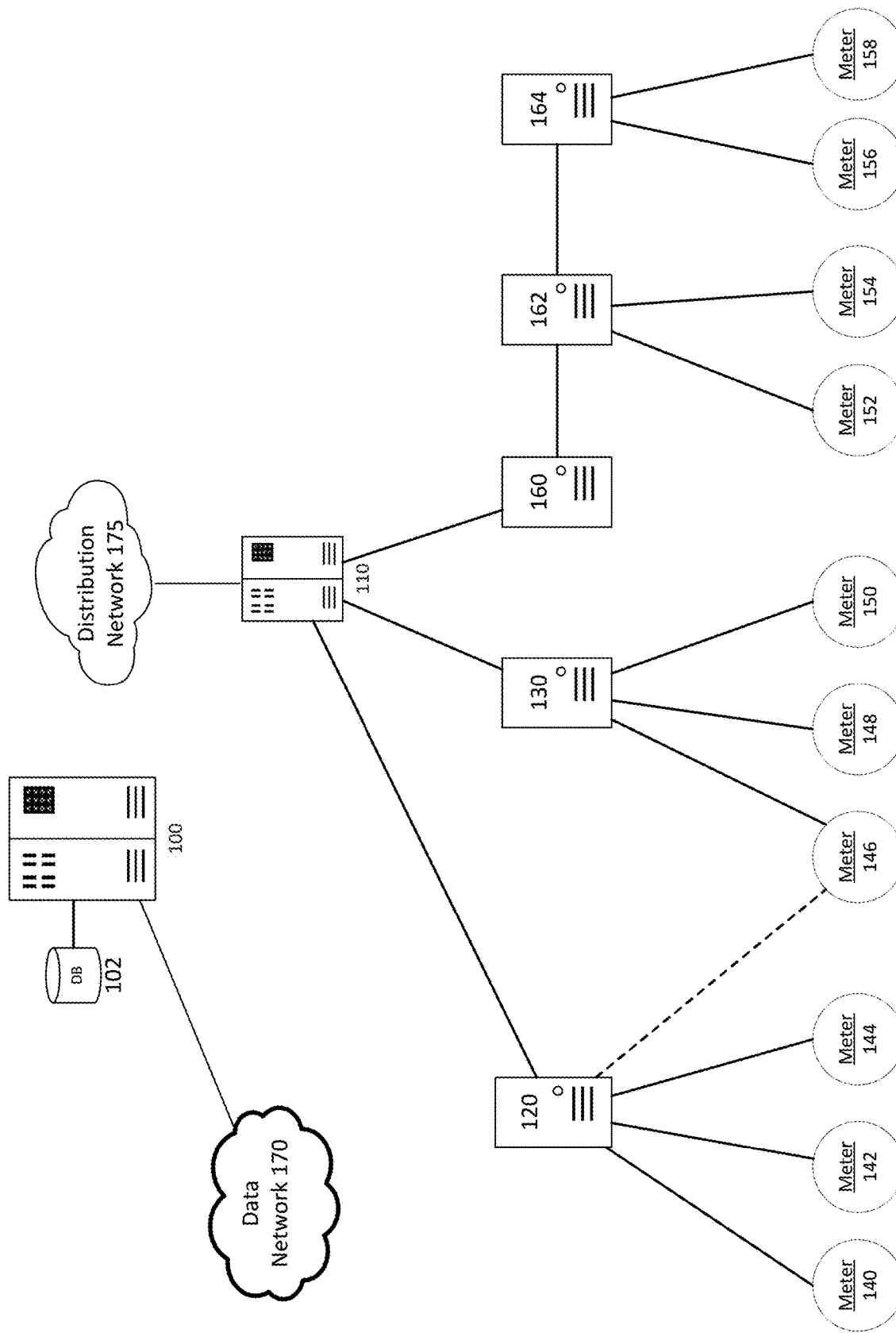
FIG. 1 depicts an exemplary operating environment, including an electrical distribution network.

FIG. 1 shows a portion of an exemplary distribution network. A substation 110 is connected to a distribution network 175, such as a power grid, and is in turn connected to transformers 120, 130, 160, 162, 164. Meters 140, 142, 144, 146, 148, 150 are connected to transformers 120 and 130.

The meters can communicate with a head-end system 100. In one example, multiple meters are connected via a wireless mesh network. A device in the network, such as a collector or PAN coordinator, may facilitate the communication of data from the wireless mesh network to the head-end system via one or more networks 170. Other types of communication between the meters and the head-end system are also possible including, but not limited to, cellular communications and power line communications.

A meter may communicate consumption information to the head-end system, as well as other information measured or detected by the meter. In some examples, the meter communicates voltage information to the head-end system. The voltage information may be associated with a time interval, such as a 15 minute interval. The meter may provide voltage information for multiple time intervals over multiple days. The head-end system may maintain voltage information provided by the meters in a database 102 or other data storage facility.

The head-end system may also maintain other types of information about the meters and other devices in the distribution network. For example, GIS information describing the location of a meter or a transformer may be maintained. In some networks, the head-end system also receives data related to the operation of a device other than a meter, such as a substation, a transformer, or other device.

The head-end system may maintain connectivity information for the meters 140, 142, 144, 146, 148, 150 and the transformers 120, 130 in a database 102. The information may be initially provided upon installation or deployment of the meters and transformers or may be obtained from a legacy system.

FIG. 1 illustrates an example where the GIS connectivity information maintained by the head-end system erroneously indicates that meter 146 is connected to transformer 120. Using the voltage information received from the meters, the head-end system may determine that meter 146 is not actually connected to transformer 120 and may identify other transformers to which meter 146 may be connected as candidate transformers. The candidate transformers may be identified using geographic location information, voltage information for the meters connected to the candidate transformers, or other types of information. The head-end system may be able to identify one of the candidate transformers with a high level of confidence and thus may update the connectivity information. For example, if the analysis indicates that meter 146 is connected to transformer 130 with a high level of confidence, then the connectivity information maintained by the head-end system may be updated to reflect this connection.

The head-end system 100 may use one or more types of analysis to identify incorrect connectivity information and to update the information, as described in more detail below.

Analysis Using Geographic Location Information

In some implementations, the GIS information maintained by the head-end system is pre-processed to remove from consideration any meter or any information that is likely to be incorrect or to possibly correct the information. For example, the location information for a meter may be determined to be inconsistent with the connectivity information for the meter or with other information maintained by the head-end system. If so, then the meter data for that meter may not be used unless the location information or the connectivity information for the meter can be corrected. Alternatively, a confidence level may be used to indicate that the accuracy of the information cannot be verified. For example, the location information and/or the connectivity information for a meter may be assigned a confidence level indicating a relative level of confidence that the information is correct.

Nearest Neighbor Analysis: When a meter communicates on a wireless mesh network, the meter maintains a list of neighboring nodes. The geographic information for the meter and its neighboring nodes may be used to validate the location information for the meter.

When a meter communicates with the head-end system, the communication may include the identity of a neighboring node (e.g., another meter, router, or other node in the wireless mesh network). This can be the first hop that a network message takes between the meter and the head-end system, also referred to herein as the nearest neighbor. The system can correlate the location information for the meter and the neighboring node. If, for example, the location information for the meter and nearest neighbor indicates that the meter and the nearest neighbor are located too far apart to conduct network communication, the system can flag the location information for the meter as being incorrect or may determine that additional analysis is needed. In some implementations, multiple communications from the meter are analyzed prior to determining that the location information for the meter are incorrect. The system can also assign a confidence level to the location information for the meter in the database based on the nearest neighbor identified.

Figure 2:
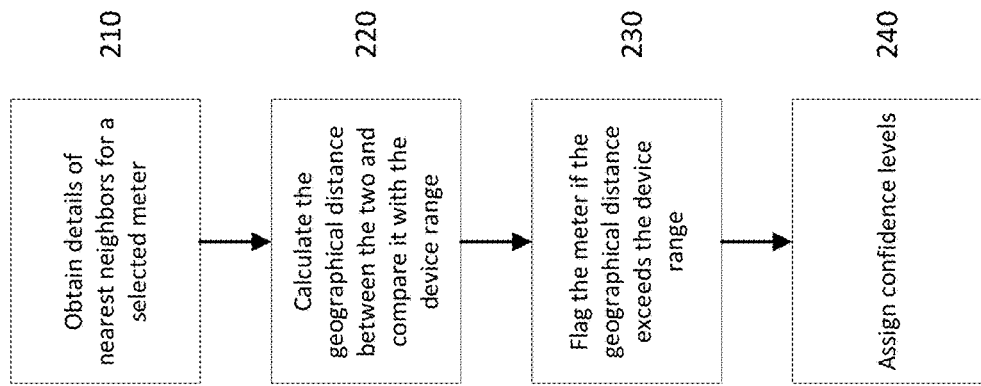
FIG. 2 depicts a flowchart of an exemplary method for a geospatial analysis using nearest neighbor data.

FIG. 2 shows an exemplary method using nearest neighbor analysis. In step 210, details regarding the meter and the nearest neighbors for the meter are identified. The nearest neighbors may be identified using communications received from the meter and the details may include geographic location information for the meter and the nearest neighbors. In step 220, the geographical distance between the meter and the nearest neighbors are calculated and compared with the maximum communication range of the communication devices used by the meter and the nearest neighbors. In step 230, the meter is flagged if the distance between the meter and its nearest neighbors exceed the maximum communication range. In step 240, a confidence level is assigned to the location information for the meter based on the distance between the meter and the nearest neighbors.

Figure 3:
FIG. 3 depicts exemplary communication ranges for nodes in a wireless network.

FIG. 3 shows an example of a meter's location being updated using nearest neighbor analysis. The location information for meter 301 initially corresponds to location 310a. The meter 301 communicates over a wireless network using nodes 330, 340, and 350 as nearest neighbors, each with a location and a communications range of 335, 345, and 355 respectively. Using this information, the system determines that the location information for meter 301 is inaccurate because location 310a is too far from nodes 340 and 350. Using the location information for neighbor nodes 330, 340, 350 and the communication ranges 335, 345, and 355, the meter's location information can be updated to location 310b. A confidence level may also be assigned to the updated location information.

Proximity Analysis: The head-end system may perform a geographical proximity analysis on location information for a meter and a transformer. The physical distance between the transformer and the meter is calculated and a confidence level may be assigned to the connectively information based on the distance. This method may detect outliers and meters or other assets with incorrect location information. In one example, it includes determining whether there is a transformer that is located closer to the meter than the transformer identified by the current transformer to meter connectivity information, i.e. the GIS connectivity information. In some implementations, only the location information, e.g. latitude and longitude coordinates, for the meter and the transformer are considered. Geographical features like vegetation and water bodies are not considered. If geographic features are not considered, then this may impact any confidence level assigned to the location information since geographical features may impact the feasibility of connecting a meter to a transformer.

Figure 4:
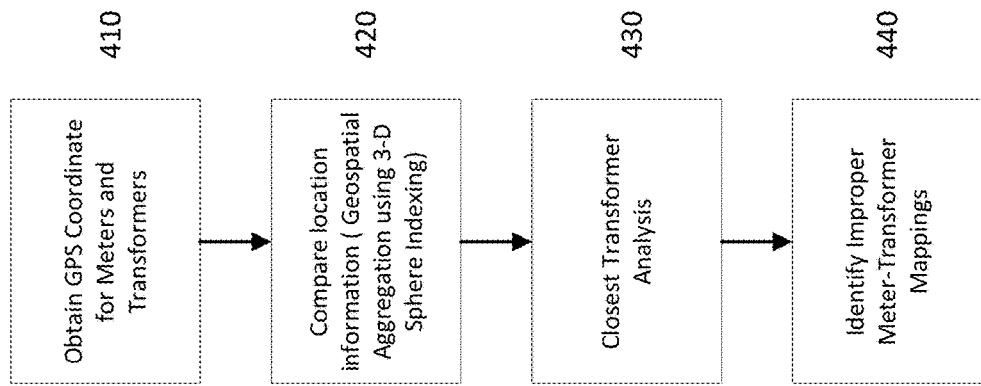
FIG. 4 depicts a flowchart of an exemplary method for a geospatial analysis using geographic location information.

FIG. 4 illustrates a flowchart of an exemplary method for geospatial analysis. In step 410, the system obtains location information for the meters and transformers in a geographic area. The location information is this example is GPS coordinate data. In step 420, the system compares the location information for a meter and a transformer. In one implementation the method compares the location information using GeoSpatial Aggregation using 3-D Sphere Indexing. In step 430, the closest transformers are identified and scored based on distance. Finally, in step 440, any improper meter-transformer associations are identified.

Figure 5:
FIG. 5 depicts an exemplary display output using GIS location information.

FIG. 5 is an exemplary output showing the location information for a number of meters for a particular utility. The majority of the meters are found to be clustered together around a substation or located along a distribution line. The outliers suggest incorrect location information in the GIS system for those meters. These outliers also may be identified by a nearest neighbor analysis or proximity analysis since these meters will be found to be far away from their nearest neighbors or their GIS transformers, i.e., the transformers identified by the GIS connectivity information.

Having identified a meter as having location information that is inconsistent with other data in the system, the system may flag the location information, assign a confidence level to the location information, or may ignore the meter in later analysis.

Analyzing Connectivity Information

Voltage data or other operational data may be analyzed to confirm GIS connectivity information. In some examples, the voltage data is analyzed after the location information for the meters is validated, or only voltage data for those meters whose location information was verified are considered. A voltage profile comprises voltage values or changes in voltage values over a number of intervals. A voltage profile may be associated with a meter or other distribution network asset.

Outage Detection Analysis: Voltage data may be used to identify and cluster meter outages. Voltage data for meters connected to the same transformer according to the GIS connectivity information are analyzed to determine if the voltage data is consistent. Meters connected to transformers affected by an outage (e.g., downstream of a protective device) are expected to behave similarly. Since an outage is an exceptional condition, the data for this analysis is not always available.

Figure 6:
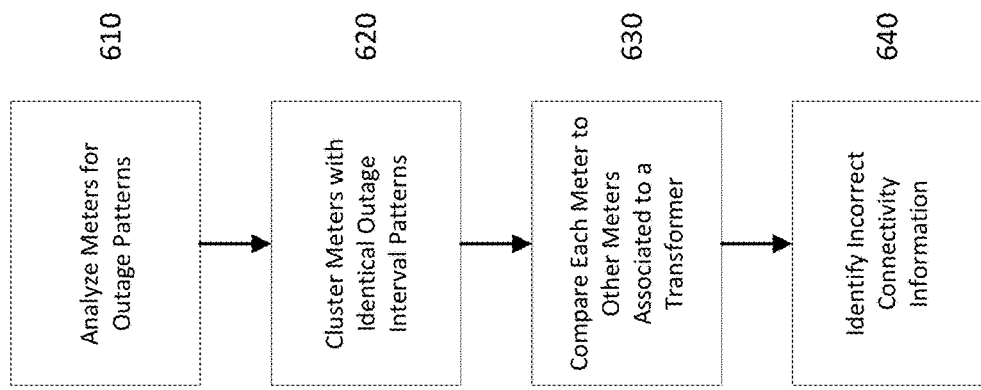
FIG. 6 depicts a flowchart of an exemplary method for outage detection analysis.

When a transformer experiences an outage, but a meter that is connected to the transformer according to the GIS connectivity information still reports receiving power, the meter is flagged as being associated with the incorrect transformer. An exemplary method for identifying incorrect connectivity information based on an outage analysis is shown in FIG. 6. In step 610, the method analyzes voltage data from a number of meters to determine outage patterns. In step 620, the method clusters together meters with identical outage patterns. In step 630, the method selects a transformer associated with a meter in one of the clusters and compares the meters associated with the selected transformer based on the GIS connectivity information. In step 640, the method identifies incorrect GIS connectivity information when the voltage information for meters associated with the selected transformer is inconsistent. For example, if voltage data for one meter indicates that the meter remained powered when the voltage data for the remaining meters indicates that the meters experienced an outage, then the meter is flagged as having incorrect connectivity information.

Figure 7:
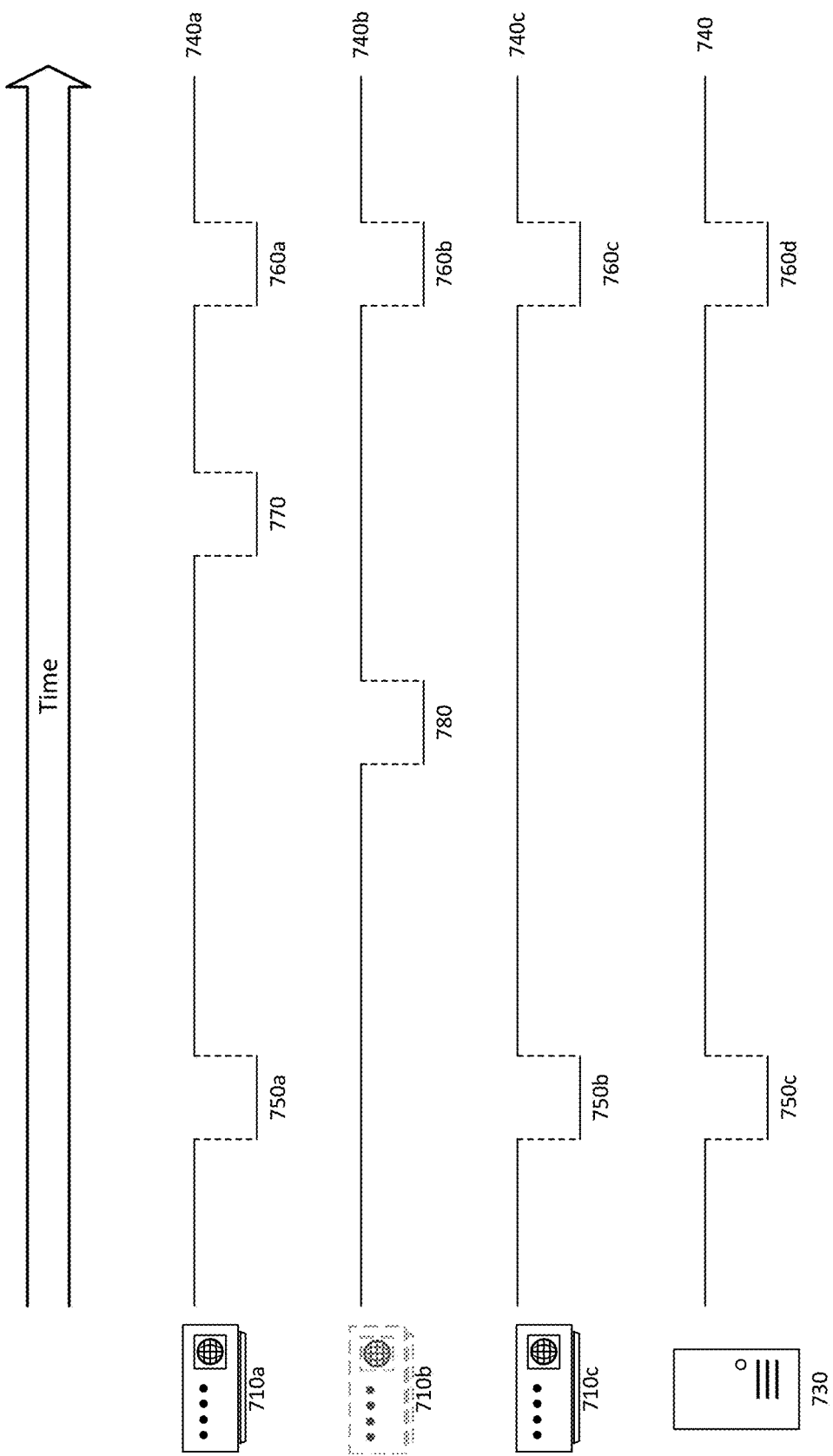
FIG. 7 depicts exemplary outages for nodes in a distribution network.

A further example of this is shown in FIG. 7. Meters 710a-c are identified as being associated with transformer 730 according to the GIS connectivity information. Meters 710a-c have detected power levels of 740a-c respectively. The transformer 730 has a detected power level of 740. When transformer 730 experiences a power outage at a time corresponding to 750c, meters 710a and 710c also experience an outage, as shown by 750a and 750b in the power levels. However, meter 710b does not experience an outage, and is flagged as being incorrectly associated with transformer 730.

Meters can experience outages independent of the transformers, such as with meter 710a at 770, and meter 710b at 780. The system may not take into account outages of this nature or that do not impact a minimum number of meters or other devices when evaluating connectivity information. Additionally, outages can overlap, such as when an outage affects multiple transformers, such as at 760a-d. In this case, the system can use additional information, such as information about previous outages (i.e. the outage at 750a-c) or information that an outage affected multiple transformers, to determine whether to flag a meter.

Voltage Correlation Analysis: The system may also use voltage data with statistical methods to evaluate GIS connectivity information. Voltage data among sibling meters (i.e., meters connected to the same transformer) are generally highly correlated so voltage data may be used to flag any meters that are not correctly associated with a transformer.

Voltage data may be desirable since voltage measurements may provide a better indication of the overall behavior of the upstream distribution system than energy and power measurements. Energy and power may be causes of system behavior, whereas voltage measurements may show the effects.

Some implementations use a voltage profile for the analysis. A voltage profile may be based on either voltage values or changes in voltage values. A voltage profile based on voltage values includes a voltage value for each interval period during a historical time range for a meter. A voltage profile based on changes in voltage values includes a change in voltage values for each interval period during the historical time range for a meter, where the change in voltage value is the change from one interval period to the next interval period. Other ways of creating a voltage profile are also possible.

Some methods use voltage data to compute correlation coefficients or other types of correlation values. The voltage data may include data for all of the intervals in a predetermined time range or may include corrected or masked data. A base approach calculates voltage correlations for all intervals. A voltage correction approach smooths or corrects the voltage data across intervals to eliminate fluctuations such as spikes or dips. A combined masking approach accounts for single meter outage events. Voltage intervals with outage-like dips and subsequent spikes are removed from the analysis for all sibling meters connected to a transformer and voltage correlations for the interval periods remaining after removing a super set of the masked intervals are calculated. An individual masking approach increases the accuracy of the combined masking approach by ignoring irregular voltage interval data on a one-to-one basis. Erratic intervals are identified for each meter and a sum of the two sets is masked while correlating interval periods on a per meter basis.

As an example of the various masking approaches, consider correlating voltage data for three meters (Meter A, Meter B, and Meter C) over a 24-hour period. Meter A has a single meter outage between 9:00 AM and 10:00 AM. Meter B has no outages. Meter C has a single meter outage between 3:00 PM and 4:00 PM. Data from each individual meter is correlated against each other meter in the set (i.e., a correlation is calculated for meters pairs AB, BC, and AC).

In the combined masking approach, the data for the 9:00 AM to 10:00 AM time period and the 3:00 PM and 4:00 PM time period is ignored for all three meters and is not used to calculate the correlations between the three meters.

In the individual masking approach, the data for the 9:00 AM to 10:00 AM time period is ignored for the AB and AC calculations, but is still used for the BC calculation since neither meter B nor meter C experienced an outage during that time period. The data for the 3:00 PM and 4:00 PM time period is ignored for the BC and AC calculations, but is still used for the AB calculation since neither meter A nor meter B experienced an outage during that time period.

Figure 8:
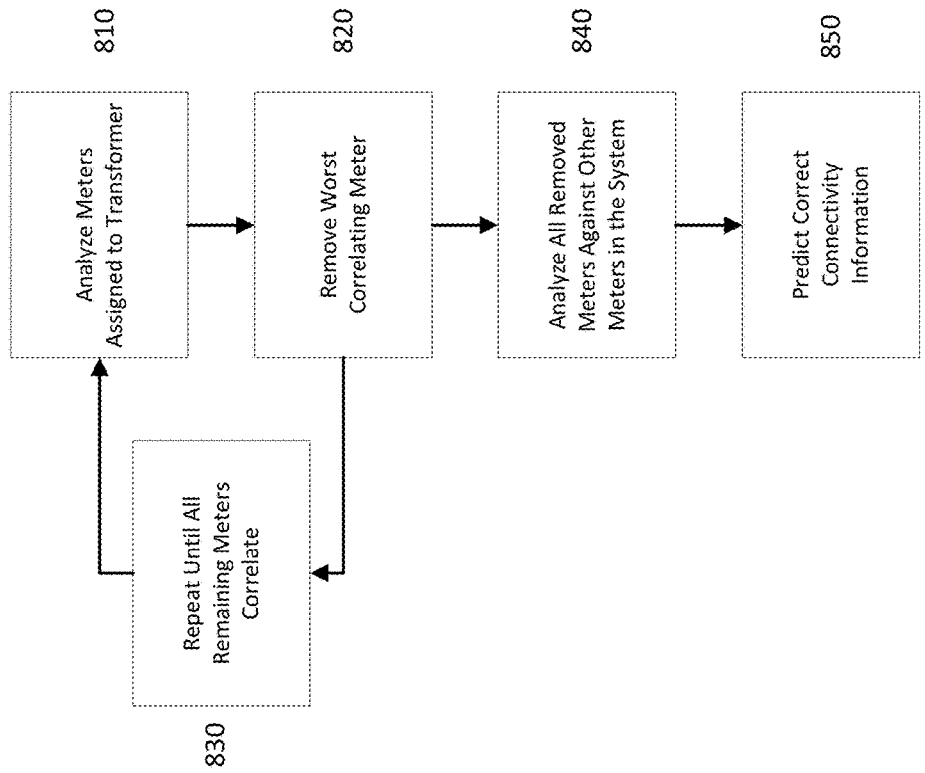
FIG. 8 depicts a flowchart of an exemplary method for voltage correlation analysis.

FIG. 8 illustrates an exemplary method using voltage correlation. In step 810, the method compares voltage data for the meters connected to a transformer based on the GIS connectivity information. FIG. 9A provides an example that compares voltage data for 6 meters connected to the same transformer according to the GIS connectivity information. FIG. 9B provides an example that compares voltage data for 5 meters. In step 820, the method removes the worst correlating meter from the analysis. In FIG. 9B, Meter 2 is the worst correlating meter since the correlation values for Meter 2 are the lowest amongst the 5 meters. In addition to or in the alternative, the method may require that the correlation values be below a correlation threshold to be removed from the analysis. In step 830, the process of removing any other meters that do not correlate well is repeated until all the remaining meters correlate or the correlation values reach a threshold. FIG. 9A is an example where all the meters associated with a transformer have voltage data that correlates well with each other. This may be an exemplary output of a scenario where the voltage data confirms the accuracy of the GIS connectivity information or may be an exemplary output of a scenario where meters with voltage data that does not correlate have been removed.

Once a meter with voltage data that does not correlate has been removed from the analysis, the meter may be subject to further analysis. The voltage data for the meter may be compared with voltage data for other meters in step 840. The comparison may result in a determination that the original GIS connectivity information for the meter should be maintained, that the GIS connectivity information for the meter should be updated with a different transformer, as shown in step 850, or that the transformer identified by the original GIS connectivity information is missing.

Updating GIS Connectivity Information

Once a meter, such as Meter 2 is flagged as having GIS connectivity information that is likely incorrect, the system may attempt to identify a transformer to which the meter is likely connected and to update the GIS connectivity information.

Voltage Correlations: One method for updating the connectivity information for the meter compares the voltage profile for the flagged meter with the voltage profiles for other meters in the system. For example, the voltage profile for Meter 2 may be compared with the voltage profiles for other meters in the system to identify meters with similar voltage profiles and identify candidate transformers to which Meter 2 may be connected. In some implementations the voltage profile for a meter may be compared to the voltage profiles for all remaining meters in the system. In other implementations, a subset of the meters in the system is used.

FIG. 10 illustrates voltage correlations used in an analysis that compares voltage data for Meter 2 with voltage data for other meters in the system. Meter 2 is identified by MeterId 5355098 in column 1 and is currently associated with the transformer identified by Transformer number 357765027 in column 2 according to the GIS connectivity information. The average correlation value in column 3 is based on a voltage correlation, such as that described in connection with FIG. 9B. The '# meters when removed' column indicates the number of meters associated with the transformer identified in column 2 at the time the meter was flagged. This helps keep track during subsequent iterations. For example, the transformer in question might have multiple incorrectly assigned meters which are flagged one at a time based on the lowest average correlation. Once Meter 2 is removed, voltage correlation is re-run on the transformer, analyzing its remaining 4 meters. If another meter fails to meet the correlation threshold, it will be flagged and the '# meters when removed' will be '4' to indicate there were 4 meters on the transformer at the time of analysis.

The remaining columns identify candidate transformers for Meter 2 based on the comparison of the voltage data for Meter 2 with the voltage data for other meters. The top portion 1000*a* identifies candidate transformers that have the most associated meters with voltage data that correlate with the voltage data of Meter 2. The bottom portion 1000*b* identifies candidate transformers with associated meters having voltage data that most closely correlates with the voltage data of Meter 2. The information may be used to identify one or more transformers that are more likely to be associated with Meter 2 than the transformer identified in the original GIS connectivity data shown column 2.

Other ways of identifying candidate transformers may also be used. For example, candidate transformers may be identified based on the distance between the flagged meter and the transformers. The method identifies a transformer as a candidate transformer if the distance between the flagged meter and the transformer is within a predetermined maximum distance.

Confidence Factors: For each candidate transformer, a confidence factor may be calculated indicating a probability that the flagged meter is associated with the candidate transformer. This confidence factor may be based on one or more of the following factors:

A. Average Correlation Coefficient—The average of the correlation coefficients or values between the flagged meter and each meter associated with the candidate transformer. FIG. 10 illustrates an example where the meters associated with candidate transformer 3510000704 have an average correlation value of 0.9388 and the meters associated with candidate transformer 359267299 have an average correlation value of 0.8990.

B. Total Number of Correlating Meters—The number of meters on a candidate transformer that correlate with the flagged meter above a certain threshold. If the threshold is 0.75, then FIG. 10 illustrates 5 transformers that have 10 or more meters with an average correlation value above the threshold. Candidate transformer 302523184 has 19 meters with correlation values above the threshold and candidate transformer 302523186 has 14 meters with correlation values above the threshold.

C. Candidate Transformer Distance—The distance between the flagged meter's original transformer and the candidate transformer. If the transformer identified in the original GIS connectivity information and one of the candidate transformers are relatively close, then in some situations it is more likely that the meter is connected to that candidate transformer than to another candidate transformer located further away from the original transformer.

D. Voltage Level—Whether the voltage level of the meter has been seen on the candidate transformer. This factor may use data received from the transformer or data received from other meters connected to the transformer.

E. Frequency of Prediction—Total number of days or other time period that the candidate transformer has been predicted for the flagged meter.

F. Other Conditions—For example, compatibility between the meter and transformer configurations, such as phase compatibility (if information is available). A three-phase meter is not compatible with a single phase transformer.

Each of these factors may be weighted to determine an overall confidence factor. In some examples, some of the factors provide a value that can be used without conversion in the calculation of the confidence factor, such as the average correlation coefficient or value. Other factors may provide a value that needs to be converted prior to using the value to determine the confidence factor. For example, the "Total Correlating Meters" may be converted by 1) taking the number of correlating meters associated with a transformer and dividing by the total number of meters associated with the transformer to obtain a percentage and 2) ranking the result against other candidate transformers, and assigning a value based on the rank for use in calculating the confidence factor.

Other criteria may also be used to adjust the confidence factor or weightings of the factors used to determine the confidence factor. For example, when the number of meters connected to the candidate transformer is low or a confidence level for information used to calculate one of the factors is low, then the confidence factor may be reduced. If the candidate transformer has missing location information, then the confidence factor may be reduced. In addition, a notification may be generated to report the missing data issue.

Once confidence factors have been calculated for all candidate transformers, action can be taken based on the confidence factors. If the transformer with the highest confidence factor has a confidence factor exceeding a certain threshold, the transformer can be associated with the flagged meter by updating the GIS connectivity information.

If none of the candidate transformers have a confidence factor exceeding the threshold, then other actions may be taken. For example, a notification may be generated that identifies the flagged meter, the candidate transformers, and additional information about the analysis, such as the confidence factors to allow further action to be taken.

There may be several reasons why none of the candidate transformers have a confidence factor exceeding the threshold. For example, a transformer may be missing from the GIS system or the flagged meter may be the only meter associated with the transformer. If there is a transformer that does not have any connected meters within a certain distance of the flagged meter or a certain distance of the originally associated transformer, the system may select such transformer and update the GIS connectivity information with the selected transformer.

Frequency of Analysis: The analysis described above may be run multiple times over a period of time in order to develop confidence factors sufficiently high to update GIS connectivity information, as some of the factors considered are based on the length of time an association has been predicted and some values will change as meter associations are added to the system or corrected.

For example, a voltage profile can be gathered and the analysis can be performed on a week's worth of samples at different interval periods, using a voltage profile taken at various times over the one week period, with each interval period being of a predetermined length, such as 15 minutes. The analysis may generate a set of confidence factors and predictions for each day. At the end of the week, the transformer associations with the highest confidence factors can be assigned to any flagged meters that have been identified.

Analysis Using Confidence Factors: Another method for confirming or updating the connectivity information considers a group of meters and transformers to update GIS connectivity information. This method begins by selecting a group of transformers and a group of meters. Voltage data for the group of meters is used to calculate a correlation coefficient matrix and confidence factors.

The voltage data used for the analysis is associated with a historical time range and an interval period. The historical time range may be longer than a day (e.g., 24-hour period). Exemplary historical time ranges vary and may be in the range of 1 day to 1 week. The interval period is usually shorter than the historical time range. For example, an exemplary interval period may be in the range of 5 minutes to 1 hour.

The method begins by selecting a distribution transformer. Once the distribution transformers is selected, the method selects an additional k number of distribution transformers within a distance of the selected transformer, e.g., within a radius $r_1$ of the selected distribution transformer. In one example, k is 10 and $r_1$ is in the range of 200 m to 300 m. When there are more than k transformers within the radius, the k transformers selected may be those located closest to the selected transformer. The selected transformer and the additional k transformers are referred to herein as a group of transformers.

The method selects all the meters connected to this group of transformers based on the GIS connectivity information. In addition, the method selects any other meters within a certain radius $r_2$. of the group of transformers based on the GIS location information for the meters. In one example, $r_2$ is approximately 800 m. The meters connected to the group of transformers and any additional meters within radius $r_2$ are referred to herein as being associated with the group of transformers.

The method calculates correlation coefficients between the meters by comparing the profile of one meter with the profiles of the other meters associated with the group of transformers. Once the correlation coefficients are calculated, the method builds a block sparse matrix of correlation coefficients with rows and columns corresponding to the meters associated with the group of transformers. The process of building the block sparse matrix is iterative. After the matrix is populated with the correlation coefficients for the meters associated with the group of transformers, a next transformer that has not already been evaluated is selected and the process is repeated. The selection of the next transformer may be random or may be based on its location relative to the previously selected transformer.

Once the matrix is built, confidence factors that provide a probability of a meter being connected to each of the transformers are calculated. In this method, two factors are used to calculate a confidence factors for a given meter. The first factor relates to identifying the meter that has the highest correlation coefficient (i.e., closest to 1) with respect to the given meter and considering the transformer to which the meter with the highest correlation coefficient is connected. This factor is referred to herein as $\rho_{ik}^m$. The value of $\rho_{ik}^m$ for the meter with the highest correlation coefficient is the value of the correlation coefficient. The value of $\rho_{ij}^m$ for the other meters (i.e., the ones that do not have the highest correlation coefficient with the given meter) is zero.

The second factor relates to an average of the correlation coefficients for the meters connected to the same transformer based on the GIS connectivity information. This factor is referred to herein as $\rho_{ik}$. The value of $\rho_{ik}$ is the average of the correlation coefficient values between the given meter (meter i) and the meters connected to transformer k. This factor is calculated on a per transformer basis.

The confidence factor of a meter i being connected to a transformer k is:

$$P_{ik}=w_1\rho_{ik}^m+w_2\rho_{ik}$$

Where $w_1$ and $w_2$ are weighting factors and $w_1+w_2=1$. The values of $w_1$ and $w_2$ may be different in different systems. In some systems the values may be selected by the utility.

For a meter i the transformer with the highest value of $P_{ik}$ is determined to be the most likely transformer to which the meter is connected. A head-end system may use this information to correct or confirm its GIS connectivity information. In some systems when there is a high confidence factor that a meter is connected to a transformer, the suggested correction may be automatically applied, but when there is a lower confidence factor, the connectivity recommendation may be subject to additional analysis or verification (e.g., field verification) prior to correction. Machine learning techniques may be used to adjust the weighting factors based on the additional analysis or verification to further improve the method.

One modification to the method for determining meter to transformer connectivity may include the use of a higher level weighted sum of probabilities based on multiple measurement time intervals to determine more weighted connectivity recommendations.

Exemplary Display Output

Figure 11:
FIG. 11 depicts an exemplary display output using GIS location and connectivity information.

The display of flagged meters can also be done by coding meter to transformer relationships using color, shape, animation, or other display characteristics. An exemplary display output is provided in FIG. 11 and FIG. 12. In this these figures, transformers are shown as color coded diamonds surrounded by a white circle. Meters are shown as triangles, wherein the triangles are colored to match the associated transformer based on the GIS connectivity information. Suspect or flagged meters may be displayed with a different colored border. This allows the display of suspect meters while still being able to visually see the original meter to transformer connectivity information.

Figure 12:
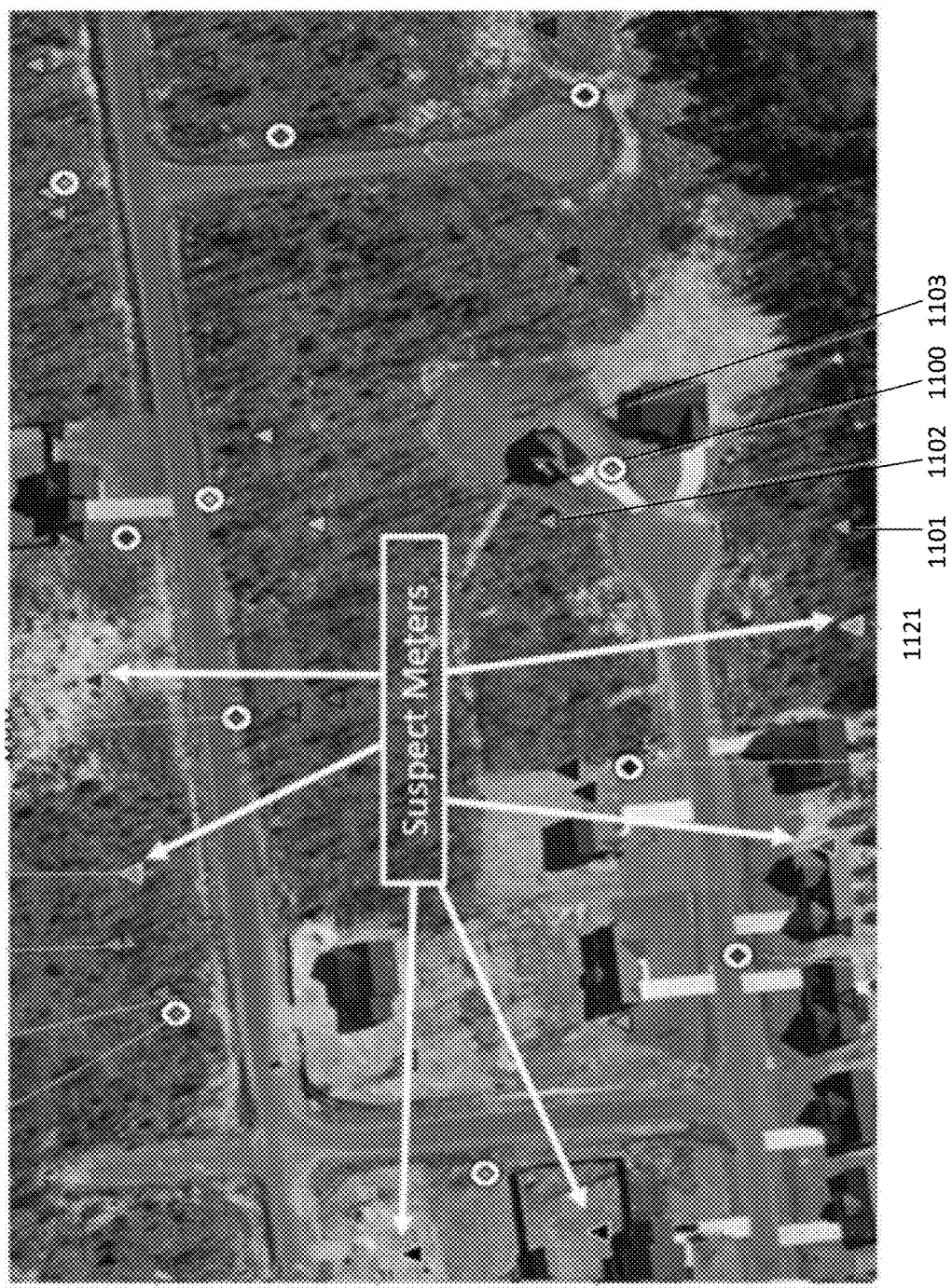
FIG. 12 depicts an exemplary display output using GIS location information, including suggested updates to the GIS connectivity information.

In this example, transformer 1100 is the same color as meters 1101, 1102 and 1103 since these three meters are associated with transformer 1100 in the database. Meter 1121 is associated with transformer 1120 based on the original GIS connectivity information and is shown in a different color which is the same color as transformer 1120 in FIG. 11. After further analysis, the meter is determined to be more likely associated with transformer 1100, so the meter is shown in the same color as transformer 1100 with a white border in FIG. 12. FIG. 12 also illustrates other meters that were flagged in the analysis.

General Considerations

Numerous specific details are set forth herein to provide a thorough understanding of the claimed subject matter. However, those skilled in the art will understand that the claimed subject matter may be practiced without these specific details.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more examples of the present subject matter. Any suitable programming, scripting, or other type of language or combinations of languages may be used to implement the teachings contained herein in software to be used in programming or configuring a computing device.

Examples of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific examples thereof, it will be appreciated that those skilled in the art, upon attaining an understanding of the foregoing, may readily produce alterations to, variations of, and equivalents to such examples. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

What is claimed is:

1. A method for analyzing voltage data to maintain an association between a transformer and a meter in a resource distribution network, comprising:
   selecting a transformer from a plurality of transformers as a selected transformer;
   selecting a set of transformers from the plurality of transformers located within a predetermined geographic distance of the selected transformer;
   selecting a set of meters, wherein each meter in the set of meters is associated with the selected transformer, is associated with one of the transformers in the set of transformers, or is located within a second predetermined geographic distance of the selected transformer;
   obtaining voltage data for each meter in the set of meters, wherein the voltage data includes measured voltages for a plurality of interval periods within a predetermined time range;
   determining a voltage profile for each meter using the voltage data; and
   for a selected meter in the set of meters:
      comparing the voltage profile for the selected meter with the voltage profiles for remaining meters in the set of meters to generate a plurality of correlation coefficients;
      identifying a maximum correlation coefficient for the selected meter, the maximum correlation coefficient being a highest correlation coefficient among the plurality of correlation coefficients, wherein the maximum correlation coefficient is for a first meter as compared to the selected meter, and wherein the first meter is associated with a first transformer;
      identifying the first transformer associated with the first meter as a candidate transformer for the selected meter;
      identifying a second set of meters, based on the second set of meters being associated with the candidate transformer with which the first meter having the maximum correlation coefficient is associated;
      computing a weighted sum of (i) the maximum correlation coefficient associated with the first meter as compared to the selected meter and (ii) an average of the plurality of correlation coefficients, as compared to the selected meter, of the remaining meters in the set of meters;
      determining, based on the weighted sum of the (i) maximum correlation coefficient and (ii) the average of the plurality of correlation coefficients, a value for a confidence factor for the candidate transformer indicating a likelihood that the selected meter is connected to the candidate transformer via the resource distribution network;
      determining an additional confidence factor for an additional candidate transformer, wherein the additional confidence factor indicates a likelihood that the selected meter is connected to the additional candidate transformer;
      determining that the confidence factor for the candidate transformer is higher than the additional confidence factor for the additional candidate transformer; and
      maintaining connectivity information for the selected meter to associate the selected meter with the candidate transformer, based on the candidate transformer having a higher confidence factor than the additional candidate transformer.

2. The method of claim 1, wherein selecting a set of transformers from the plurality of transformers located within a predetermined geographic distance of the selected transformer comprises selecting a predetermined number of transformers located with the predetermined geographic distance.

3. The method of claim 1, wherein determining a voltage profile for each meter using the voltage data, comprises determining a change in voltage values between consecutive interval periods for the interval periods within the predetermined time range and using the change in voltage values in the voltage profile.

4. The method of claim 1, wherein determining a voltage profile for each meter using the voltage data, further comprises determining a voltage for each interval period within the predetermined time range and using the voltages in the voltage profile.

5. The method of claim 1, further comprising using the connectivity information for the selected meter to generate notifications related to an outage.

6. A method performed by a head-end system to maintain an association between a transformer and a meter in a resource distribution network, comprising:
   receiving voltage data for each of a plurality of meters associated with a transformer;
   accessing a first correlation threshold used to determine whether meters are connected to transformers;
   for a first meter in the plurality of meters associated with the transformer:
      based on comparing the voltage data for the first meter with the voltage data for remaining meters in the plurality of meters associated with the transformer, determining that a correlation between the voltage data for the first meter and the voltage data for the remaining meters does not satisfy the first correlation threshold;
      determining that the first meter is incorrectly associated with the transformer, based on the correlation between the voltage data for the first meter and the voltage data for the remaining meters not satisfying the first correlation threshold;
      based on the first meter being incorrectly associated with the transformer, comparing the voltage data for the first meter with voltage data for a second plurality of meters associated with a candidate transformer to generate a plurality of correlation coefficients for the second plurality of meters;

computing a confidence factor as a function of (i) an average correlation coefficient of the plurality of correlation coefficients generated from the voltage data for the first meter and the voltage data for the second plurality of meters and (ii) a count of meters in the second plurality of meters having voltage data that satisfies a second correlation threshold;

comparing the confidence factor to a confidence threshold; and based on the confidence factor satisfying the confidence threshold, updating connectivity information maintained by the head-end system to indicate an association between the first meter and the candidate transformer.

7. The method of claim 6, wherein the confidence factor is further based on a distance between the candidate transformer and the transformer.

8. The method of claim 6, wherein the confidence factor is further based on comparing the voltage data for the first meter with voltage data for the second plurality of meters associated with the candidate transformer for multiple interval periods and multiple time ranges.

9. The method of claim 6, further comprising:
comparing the voltage data for the first meter with voltage data for a third plurality of meters associated with a second candidate transformer to determine a second confidence factor for an association between the first meter and the second candidate transformer; and comparing the confidence factor and the second confidence factor.

10. The method of claim 6, wherein the meter communicates with the head-end system via a wireless network, further comprising:
updating location information for the meter based on location information and communication ranges for neighboring nodes of the meter in the wireless network.

11. The method of claim 10, further comprising assigning a confidence level to the location information for the meter.

12. The method of claim 6, further comprising:
receiving location information for a second meter;
receiving location information for a second transformer, wherein connectivity information for the second meter associates the second meter with the second transformer;
comparing the location information for the second meter and the location information for the second transformer; and
when the comparison indicates that a distance between the second meter and the second transformer is beyond a maximum, flagging the second meter.

13. A method for analyzing voltage data to maintain an association between a transformer and a meter in a resource distribution network, comprising:
selecting a meter;

obtaining voltage data for the selected meter and voltage data for a set of meters, wherein the voltage data includes measured voltages for a plurality of interval periods within a predetermined time range;

comparing the voltage data for the selected meter with the voltage data for each meter in the set of meters to generate a plurality of correlation values, each correlation value corresponding to a comparison of the voltage data for the selected meter and the voltage data for one of the meters in the set of meters;

identifying a first set of transformers, wherein an average correlation value for meters in the set of meters associated with the first set of transformers satisfies a first correlation threshold;

computing a first confidence factor for a first candidate transformer in the first set of transformers as a function of (ii) an average of the plurality of correlation values for those of the set of meters that are associated with the first candidate transformer and (ii) a count of those of the set of meters that are associated with the first candidate transformer and have respective correlation values above a second correlation threshold;

computing a second confidence factor for a second candidate transformer in the first set of transformers as a function of (ii) an average of the plurality of correlation values for those of the set of meters that are associated with the second candidate transformer and (ii) a count of those of the set of meters that are associated with the second candidate transformer and have respective correlation values above a second correlation threshold;

determining that the first confidence factor for the first candidate transformer is higher than the second confidence factor for the second candidate transformer; and maintaining connectivity information for the selected meter to associate the selected meter with the first candidate transformer, based on the first candidate transformer having a higher confidence factor than the second candidate transformer.

14. The method of claim 13, wherein the selected meter is selected based on location information for the selected meter and location information for a previously associated transformer.

15. The method of claim 13, wherein determining a value for a confidence factor for each transformer in the first set of transformers, further comprises determining a distance between a previously associated transformer and each transformer in the first set of transformers.

16. The method of claim 13, wherein determining a value for a confidence factor for each transformer in the first set of transformers, further comprises determining phase information for the selected meter and phase information for each transformer in the first set of transformers.

\* \* \* \* \*